(12) United States Patent
Chen et al.

(10) Patent No.: US 11,984,538 B2
(45) Date of Patent: May 14, 2024

(54) THIN-FILM WHITE LED CHIP

(71) Applicant: SOUTH CHINA UNIVERSITY OF TECHNOLOGY, Guangdong (CN)

(72) Inventors: Ziming Chen, Guangdong (CN); Xuanli Ye, Guangdong (CN); Zhenchao Li, Guangdong (CN); Yong Cao, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 428 days.

(21) Appl. No.: 17/330,487

(22) Filed: May 26, 2021

(65) Prior Publication Data
US 2021/0288224 A1 Sep. 16, 2021

Related U.S. Application Data

(63) Continuation-in-part of application No. PCT/CN2020/071635, filed on Jan. 13, 2020.

(51) Int. Cl.
*H01L 33/42* (2010.01)
*H01L 33/48* (2010.01)

(52) U.S. Cl.
CPC .......... *H01L 33/42* (2013.01); *H01L 33/486* (2013.01)

(58) Field of Classification Search
CPC ..... H01L 33/42; H01L 33/486; H01L 33/505; H01L 33/38; H10K 50/00
USPC ........................................................ 257/79
See application file for complete search history.

(56) References Cited

U.S. PATENT DOCUMENTS

| | | | |
|---|---|---|---|
| 2006/0082295 A1* | 4/2006 | Chin | H10K 59/38 |
| | | | 313/506 |
| 2006/0158403 A1* | 7/2006 | Kuma | H10K 50/125 |
| | | | 345/83 |
| 2007/0029560 A1 | 2/2007 | Su | |
| 2008/0272367 A1 | 6/2008 | Cok | |
| 2019/0293561 A1 | 9/2019 | Roberts et al. | |

FOREIGN PATENT DOCUMENTS

| | | |
|---|---|---|
| CN | 1665361 A | 9/2005 |
| CN | 102569659 A | 7/2012 |
| CN | 105789478 A | 7/2016 |
| CN | 110603658 A | 12/2019 |
| CN | 111200044 A | 5/2020 |

* cited by examiner

*Primary Examiner* — Nduka E Ojeh
*Assistant Examiner* — Laura M Dykes
(74) *Attorney, Agent, or Firm* — SHIMOKAJI IP

(57) ABSTRACT

A thin-film white LED chip includes a transparent substrate, a first transparent electrode, an emissive structure, a second transparent electrode, and a first phosphorescent/fluorescent layer respectively arranged in sequence. The emissive structure includes an emissive layer, an electron injection layer and a hole injection layer respectively formed at both sides of the emissive layer, and a total thickness of the electron injection layer and the second transparent electrode (in an inverted structure) or a total thickness of the hole injection layer and the second transparent electrode (in a conventional structure) is smaller than a length of one emission wavelength of the emissive layer. The evanescent wave generated by total internal reflection can penetrate into and be absorbed by the first phosphorescent/fluorescent layer to further emit light, thereby the overall external quantum efficiency of the LED chip is improved.

15 Claims, 7 Drawing Sheets

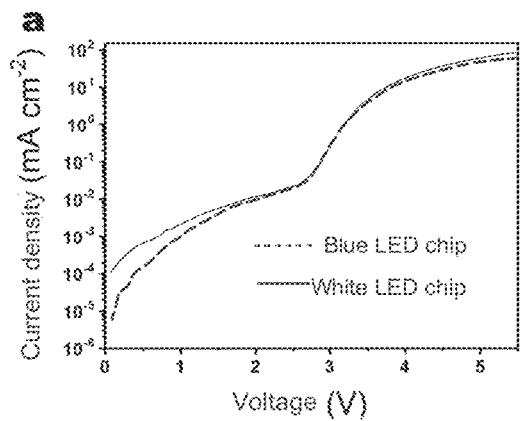
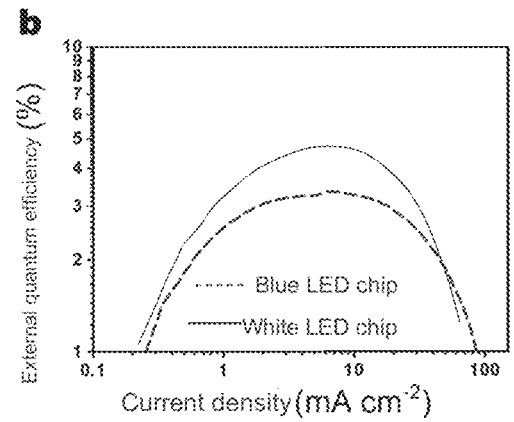
FIG. 8a       FIG. 8b
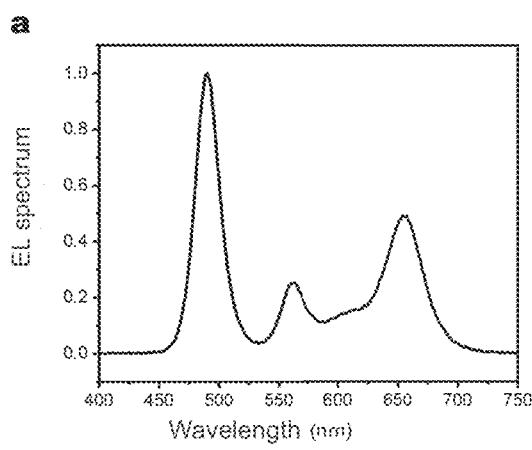
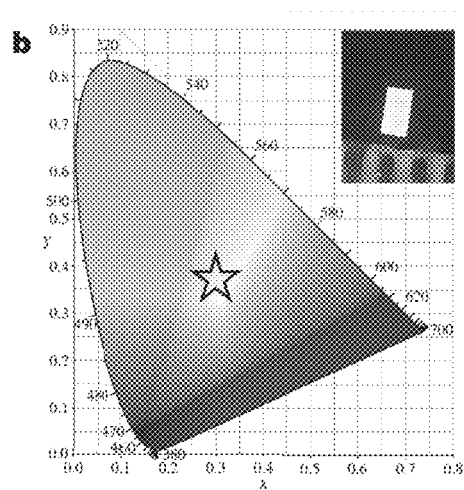
FIG. 9a       FIG. 9b

THIN-FILM WHITE LED CHIP

CROSS REFERENCE TO RELATED APPLICATIONS

This application is a continuation-in-part application of International (PCT) Patent Application No. PCT/CN2020/071635, filed on Jan. 13, 2020. The contents of the above-identified application are incorporated herein by reference.

FIELD OF THE INVENTION

The present invention relates to technical field of light emitting diodes (LEDs), and in particular to a thin-film white LED chip with high external quantum efficiency and low production cost.

BACKGROUND OF THE INVENTION

White light illumination is closely related to people's work and lives, and white light illumination technology has already been greatly developed in the past several decades. Specifically, white LEDs have become one of the best alternatives to traditional lighting devices (such as incandescent lamps and fluorescent lamps), therefore, it is a mainstream to use the energy-saving and environmentally friendly white LEDs as the lighting devices nowadays. While the traditional white LEDs are gradually replaced by thin-film white LEDs, because the latter have ultra-thin functional layers (in nanometer scale), cause less material consumption, and are compatible with solution processes such as blade coating and printing for low-cost, large-scale light sources.

According to FIG. 1, there are four main strategies for realizing thin-film white LEDs to date. Strategy A is to use a blue LED chip (with a peak emission wavelength of 430 nm to 500 nm) to excite bicolor phosphorescent/fluorescent materials of red (with a peak emission wavelength of 600 nm to 780 nm) and green (with a peak emission wavelength of 500 nm to 560 nm) to comprise white light, or to excite monochromatic yellow phosphorescent/fluorescent material (with a peak emission wavelength of 560 nm to 600 nm) to comprise white light. Strategy B to use an ultraviolet LED chip (with a peak emission wavelength of 200 nm to 430 nm) to excite phosphorescent/fluorescent materials of red, green and blue (or complementary colors) to comprise white light. Two advantages of the aforementioned two strategies which combine electroluminescence and photoluminescence are the simple drive circuit design and low cost for the fabrication of white LEDs. At the same time, phosphorescent/fluorescent materials of various colors are often added to the encapsulation layer of the blue (or ultraviolet) LED chip, which is far away from the emissive layer of the blue (or ultraviolet) LED chip, therefore, it is a far-field excitation. Moreover, the phosphorescent/fluorescent materials only down-convert the energy of the photons which can escape from the LED chip.

According FIG. 1, Strategy C is to construct an electroluminescent LED chip with red, green and blue emissive layers vertically stacked, and the emissions of three colors are blended into white light. Strategy D is to construct an electroluminescent LED chip with red, green and blue emissive layers horizontally stacked, and the emissions of three colors are blended into white light. These two strategies are merely based on electroluminescence methods. Because the external quantum efficiency of red and green LEDs is higher than that of blue LEDs, Strategies C and D can achieve higher white LED efficiency than Strategies A and B; at the same time, since the red, green and blue LEDs can be driven independently in Strategy D, therefore color temperature of white light is controllable by adjusting the proportions of red, green and blue photons.

As shown in FIG. 2, in the existing Strategies A and B, the refractive indices of the general blue and ultraviolet LED chips 100 are much larger than that of the encapsulating material 200 (epoxy resin, usually) that contains phosphorescent/fluorescent materials 210 inside. Therefore, when photons propagate from a high-refractive-index material to a low-refractive-index material, a severe total internal reflection occurs inside the chip 100 (as shown by the arrow in FIG. 2), which limits the external extraction of photons. Moreover, as the phosphorescent/fluorescent materials 210 are added inside the encapsulating layer 200, therefore, they are in the far-field position that is far away from the LED chip (the actual distance between the phosphorescent/fluorescent materials 210 and the emissive layer of the LED chip 100 is more than several times of the emission wavelength). In such a case, only photons within critical angle can escape to the outside of the chip and further reach the encapsulating layer 200 and then be absorbed by the phosphorescent/fluorescent materials 210, which further excites the phosphorescent/fluorescent materials 210. However, the external quantum efficiency of blue and ultraviolet LEDs is low, and the photoluminescence quantum efficiency of phosphorescent/fluorescent materials is generally less than 100%, which dramatically affects the overall efficiency of white LEDs (i.e. resulting in an even poorer efficiency of white LEDs based on the combination of electroluminescence and photoluminescence, compared with the original blue and ultraviolet LEDs). In addition, for Strategy B, the strong ultraviolet emission is harmful to the human health, especially under long-term exposure. Therefore, Strategy A, which uses blue LED chips to excite red/green (or yellow) phosphorescent/fluorescent materials based on the combination of electroluminescence and photoluminescence, is still the first choice for commercial white LEDs, despite its relatively low efficiency.

Referring to FIG. 1 again, for Strategy C, the device fabrication is complicated as it involves a thin film deposition process establishing more than a dozen layers, which results in a high cost of device, although this strategy can lead to a high-efficiency white LED chip. For Strategy D, each of the red, green and blue LEDs needs independent drive circuit, i.e., three different drive circuits are needed, and hence results in a complicated drive circuit design that causes a high cost; in the meantime, this design sacrifices the horizontal space, which is not excellent to be a white-light-illuminating device. By this token, the market share of white-light-illuminating device based on Strategies C and D is very low, due to their expensive production cost.

Therefore, it is necessary to develop a thin-film white LED chip that can not only significantly improve the efficiency of main-stream white LEDs which are based on the combination of electroluminescence and photoluminescence, but also reduce the energy consumption and production cost, so as to solve the aforementioned problems in the prior art.

SUMMARY OF THE INVENTION

An objective of the present invention is to provide a thin-film white LED chip, which significantly improves external quantum efficiency, reduces lighting energy consumption, and reduces production cost.

To achieve the above objective, the present invention provides a thin-film white LED chip includes a transparent substrate, a first transparent electrode, an emissive structure, a second transparent electrode, and a first phosphorescent/fluorescent layer respectively arranged in sequence. The emissive structure includes an emissive layer, an electron injection layer and a hole injection layer respectively formed at both sides of the emissive layer, and a total thickness of the electron injection layer and the second transparent electrode (in an inverted structure) or a total thickness of the hole injection layer and the second transparent electrode (in a conventional structure) is smaller than a length of one emission wavelength of the emissive layer.

Preferably, the emissive layer includes an ultraviolet emissive material with an emission wavelength of 200 nm to 430 nm or a blue emissive material with an emission wavelength of 430 nm to 500 nm.

Preferably, the emissive structure includes the hole injection layer, the emissive layer, and the electron injection layer respectively arranged in sequence, the electron injection layer is adjacent to the second transparent electrode, and a thickness of the electron injection layer is less than 200 nm, and a thickness of the hole injection layer is less than 1000 nm.

Preferably, the emissive structure includes the electron injection layer, the emissive layer, and the hole injection layer respective arranged in sequence, the hole injection layer is adjacent to the second transparent electrode, and a thickness of the hole injection layer is less than 200 nm, and a thickness of the electron injection layer is less than 1000 nm.

Preferably, a material of the electron injection layer and the hole injection layer is at least one selected from a group consisting of organic polymer and small molecule, metal oxide, inorganic semiconductor material, and organic-inorganic composite; and a material of the emissive layer is at least one selected from a group consisting of organic material, quantum dot and nanocrystalline material, inorganic material, and organic-inorganic hybrid material.

Preferably, a thickness of the second transparent electrode is less than 100 nm, a thickness of the first transparent electrode is less than 1000 nm, and a material of the second transparent electrode and the first transparent electrode is at least one selected from a group consisting of ultra-thin metal film, patterned metal film, metal nanowire, metal nanorod, metal nanoparticle, organic polymer and small molecule, metal oxide, and organic-inorganic composite.

Preferably, the thin-film white LED chip further includes a second phosphorescent/fluorescent layer formed at a side of the transparent substrate away from the first transparent electrode, and a thickness of both the first phosphorescent/fluorescent layer and the second phosphorescent/fluorescent layer is less than 1 mm.

Preferably, both the first phosphorescent/fluorescent layer and the second phosphorescent/fluorescent layer include at least one selected from a group consisting of a blue emissive material with an emission wavelength of 430 nm to 500 nm, a green emissive material with an emission wavelength of 500 nm to 560 nm, a yellow emissive material with an emission wavelength of 560 nm to 600 nm, and a red emissive material with an emission wavelength of 600 nm to 780 nm.

Preferably, materials of the first phosphorescent/fluorescent layer and the second phosphorescent/fluorescent layer are at least one selected from a group consisting of organic material, quantum dot and nanocrystalline material, inorganic material, and organic-inorganic hybrid material.

Preferably, the first transparent electrode, the emissive layer, the electron injection layer, the hole injection layer, the second transparent electrode, the first phosphorescent/fluorescent layer, and the second phosphorescent/fluorescent layer are formed by vapor deposition, sputtering, spin coating, blade coating, evaporation, inkjet printing, drip coating, roll-to-roll printing, slot-die coating, screen printing, spraying or mechanical printing.

In comparison with the prior art, the thin-film white LED chip of the present invention includes a transparent substrate, a first transparent electrode, an emissive structure, a second transparent electrode, and a first phosphorescent/fluorescent layer respectively arranged in sequence. Specifically, the emissive structure includes an emissive layer, an electron injection layer and a hole injection layer respectively formed at both sides of the emissive layer, and a total thickness of the electron injection layer and the second transparent electrode (in an inverted structure) or a total thickness of the hole injection layer and the second transparent electrode (in a conventional structure) is smaller than a length of one emission wavelength of the emissive layer. Firstly, because a reflective metal electrode in the prior art is replaced with the second transparent electrode, the photons emitted by the emissive layer will not be totally reflected in this direction, and will have an opportunity to penetrate into the first phosphorescent/fluorescent layer. Secondly, the total thickness of the electron injection layer and the second transparent electrode (in an inverted structure) or the total thickness of the hole injection layer and the second transparent electrode (for a conventional structure) is less than a length of one emission wavelength of the emissive layer, so that the evanescent wave generated by total internal reflection can penetrate into and be absorbed by the first phosphorescent/fluorescent layer so as to emit down-converted photons. By absorbing the evanescent wave and then emitting photons, the actual utilization of internal photons in the chip is improved, and hence improving the overall external quantum efficiency of the LED chip. Thereby, the lighting energy consumption is reduced, meanwhile the white light emission can be ensured, and the production cost is low.

BRIEF DESCRIPTION OF THE DRAWINGS

The accompanying drawings facilitate an understanding of the various embodiments of this invention. In such drawings:

FIG. 8a shows voltage—current density curves of a perovskite blue LED chip and a perovskite tricolor white LED chip;

FIG. 8b shows current density—external quantum efficiency curves of a perovskite blue LED chip and a perovskite tricolor white LED chip;

FIG. 9a is an electroluminescence spectrum of a perovskite tricolor white LED chip;

FIG. 9b is a chromaticity coordinate diagram of a perovskite tricolor white LED chip.

DETAILED DESCRIPTION OF ILLUSTRATED EMBODIMENTS

Figure 1:
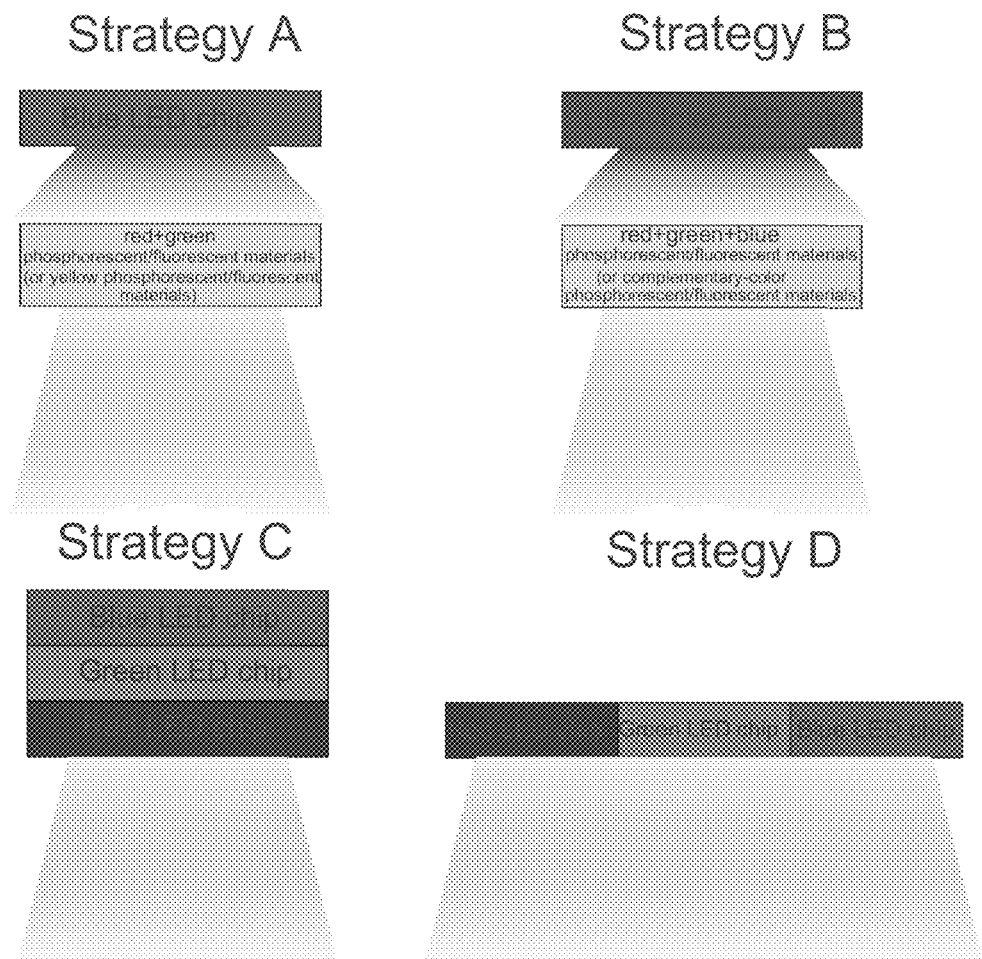
FIG. 1 is a schematic diagram of the realization of a thin-film white LED in the prior art.
Figure 2:
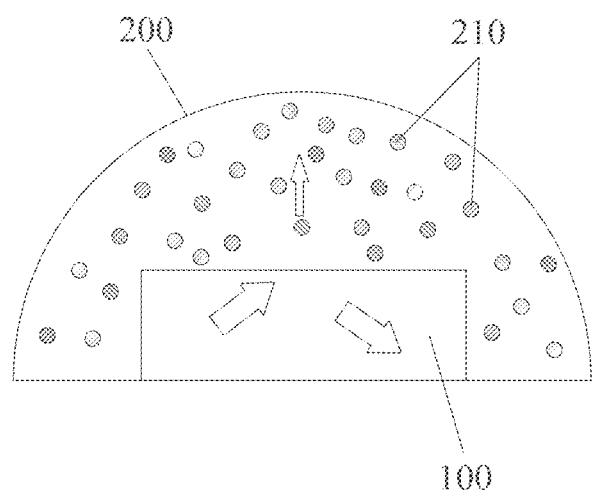
FIG. 2 is a schematic diagram of the light-emitting principle of a thin-film white LED chip in the prior art.

The embodiments of the present invention will now be described with reference to the accompanying drawings. Similar element numbers in the accompanying drawings represent similar elements.

In order to explain in detail the technical content, construction features, the purpose and effect achieved by the present invention, the following combined with the implementation and the attached drawings are described in detail.

Referring to FIGS. 3a-4b, a thin-film white LED chip 100 of the present invention includes a transparent substrate 110, a first transparent electrode 120, an emissive structure 130, a second transparent electrode 140, and a first phosphorescent/fluorescent layer 150 respectively arranged in sequence. Specifically, in an inverted structure, the emissive structure 130 includes a emissive layer 131, an electron injection layer 133 and a hole injection layer 132 respectively formed at both sides of the emissive layer 131, and a total thickness of the electron injection layer 133 and the second transparent electrode 140. In a conventional structure, the position of electron injection layer 133 and hole injection layer 132 exchanges, and a total thickness of the hole injection layer 132 and the second transparent electrode 140 is smaller than a length of one emission wavelength of the emissive layer 131 (see details below).

Further, the thin-film white LED chip 100 of the present invention includes a second phosphorescent/fluorescent layer 160 formed at a side of the transparent substrate 110 away from the first transparent electrode 120.

In the following, referring to FIGS. 3a-4b, thin-film white LED chips 100 according to different embodiments of the present invention will be described separately.

Figure 3A:
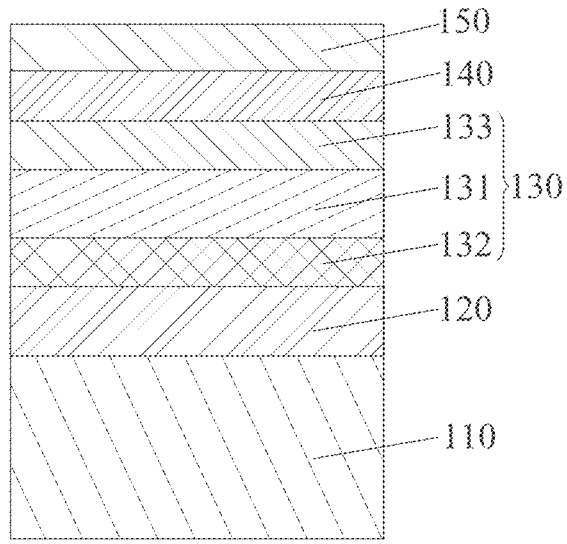
FIG. 3a is a schematic structural diagram of a thin-film white LED chip with an inverted structure according to one embodiment of the present invention.

Referring to FIG. 3a, the thin-film white LED chip 100 in this embodiment is an inverted structure, and specifically includes a transparent substrate 110, a first transparent electrode 120, an emissive structure 130, a second transparent electrode 140, and a first phosphorescent/fluorescent layer 150 respectively arranged in sequence. More specifically, the emissive structure 130 includes a hole injection layer 132, an emissive layer 131, and an electron injection layer 133 respectively arranged in sequence, and the hole injection layer 132 is formed between the first transparent electrode 120 and the emissive layer 131, the electron injection layer 133 is formed between the emissive layer 131 and the second transparent electrode 140. Further, the thickness of the hole injection layer 132 is less than 1000 nm, and the thickness of the electron injection layer 133 is less than 200 nm. In addition, the total thickness of the electron injection layer 133 and the second transparent electrode 140 is less than a length of one emission wavelength of the emissive layer 131.

In this embodiment, the emissive layer 131 includes an ultraviolet emissive material with an emission wavelength of 200 nm to 430 nm or a blue emissive material with an emission wavelength of 430 nm to 500 nm. Therefore, the total thickness of the electron injection layer 133 and the second transparent the electrode 140 is preferably less than 200 nm or less than 430 nm, which depends on different materials of the emissive layer 131.

Continuing to refer to FIG. 3a, the emissive material of the emissive layer 131 is preferably at least one of organic material, quantum dot and nanocrystalline material, inorganic material, and organic-inorganic hybrid material, which is not limited however. In addition, the material of the electron injection layer 133 and the hole injection layer 132 can be at least one of organic polymer and small molecule, metal oxide, inorganic semiconductor material, and organic-inorganic composite, which is not limited however.

Referring to FIG. 3a again, in this embodiment, the thickness of the first transparent electrode 120 is less than 1000 nm, and the thickness of the second transparent electrode 140 is less than 100 nm. As described above, the thickness of the electron injection layer 133 is less than 200 nm, and the total thickness of the electron injection layer 133 and the second transparent electrode 140 is preferably less than 200 nm. In addition, the material of the first transparent electrode 120 and the second transparent electrode 140 can be at least one of ultra-thin metal film, patterned metal film, metal nanowire, metal nanorod, metal nanoparticle, organic polymer and small molecule, metal oxide, and organic-inorganic composite, which is not limited however. Furthermore, the transparent substrate 110 is a transparent non-conductive substrate, which also may be a rigid inorganic substrate or a flexible and bendable organic polymer substrate.

Referring to FIG. 3a again, it's necessary that the first phosphorescent/fluorescent layer 150 must be present in the structure of the device, and the thickness of the first phosphorescent/fluorescent layer 150 is less than 1 mm. Specifically, the first phosphorescent/fluorescent layer 150 includes at least one of a blue emissive material with an emission wavelength of 430 nm to 500 nm, a green emissive material with an emission wavelength of 500 nm to 560 nm, a yellow emissive material with an emission wavelength of 560 nm to 600 nm, and a red emissive material with an emission wavelength of 600 nm to 780 nm. In this embodiment, the material of the first phosphorescent/fluorescent layer 150 is preferably at least one of organic material, quantum dot and nanocrystalline material, inorganic material, and organic-inorganic hybrid material, which is not limited however.

Figure 3B:
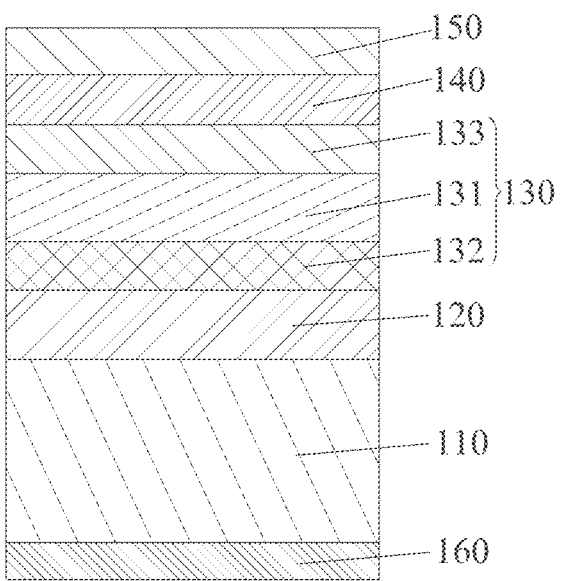
FIG. 3b is a schematic structural diagram of a thin-film white LED chip with an inverted structure according to another embodiment of the present invention.

Referring to FIG. 3b, an inverted thin-film white LED chip 100 according to another embodiment may further include a second phosphorescent/fluorescent layer 160 formed at a side of the transparent substrate 110 away from the first transparent electrode 120, and the thickness of the second phosphorescent/fluorescent layer 160 is less than 1 mm. In this embodiment, it's unnecessary that the second phosphorescent/fluorescent layer 160 must be present in the structure of the device, and the main function of the second phosphorescent/fluorescent layer 160 is to supplement the emission wavelength that the first phosphorescent/fluorescent layer 150 cannot cover.

In addition, the material of the second phosphorescent/fluorescent layer 160 is the same as that of the first phosphorescent/fluorescent layer 150, that is the material of the second phosphorescent/fluorescent layer 160 also includes at least one of a blue emissive material with an emission wavelength of 430 nm to 500 nm, a green emissive material with an emission wavelength of 500 nm to 560 nm, and a yellow emissive material with an emission wavelength of 560 nm to 600 nm, and a red emissive material with a luminescence wavelength of 600 nm to 780 nm. In this embodiment, the material of the second phosphorescent/fluorescent layer 160 is preferably at least one of organic material, quantum dot and nanocrystalline material, inorganic material, and organic-inorganic hybrid material. Of course, the material of the second phosphorescent/fluorescent layer 160 is not limited to those listed here.

As shown in FIGS. 3a-3b again, in the inverted thin-film white LED chip 100 of this embodiment, all functional layers can be formed by vapor deposition, sputtering, spin coating, blade coating, evaporation, inkjet printing, drip coating, roll-to-roll printing, slot-die coating, screen printing, spraying or mechanical printing, that is, each of the first transparent electrode 120, the hole injection layer 132, the emissive layer 131, the electron injection layer 133, the transparent electrode 140, the first phosphorescent/fluorescent layer 150 and the second phosphorescent/fluorescent layer 160 can be formed in one of the aforementioned ways, so that the forming process of the thin-film white LED chip 100 is simplified and the production cost is reduced.

Figure 4A:
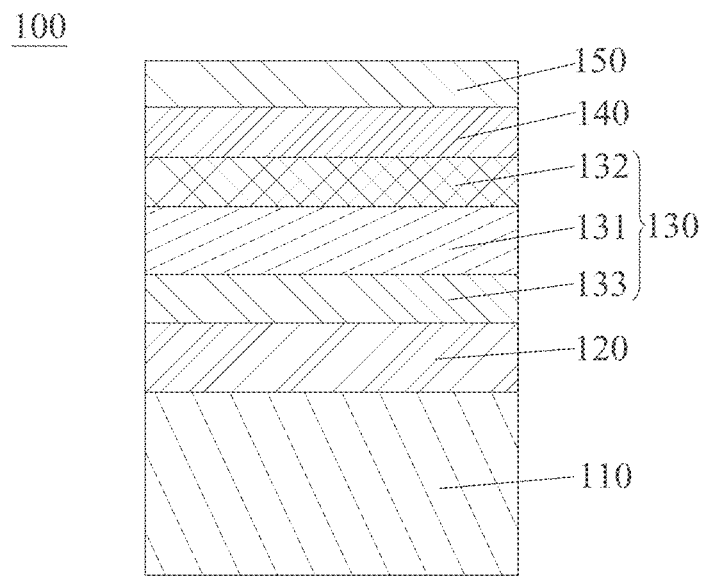
FIG. 4a is a schematic structural diagram of a thin-film white LED chip with a conventional structure according to one embodiment of the present invention.
Figure 4B:
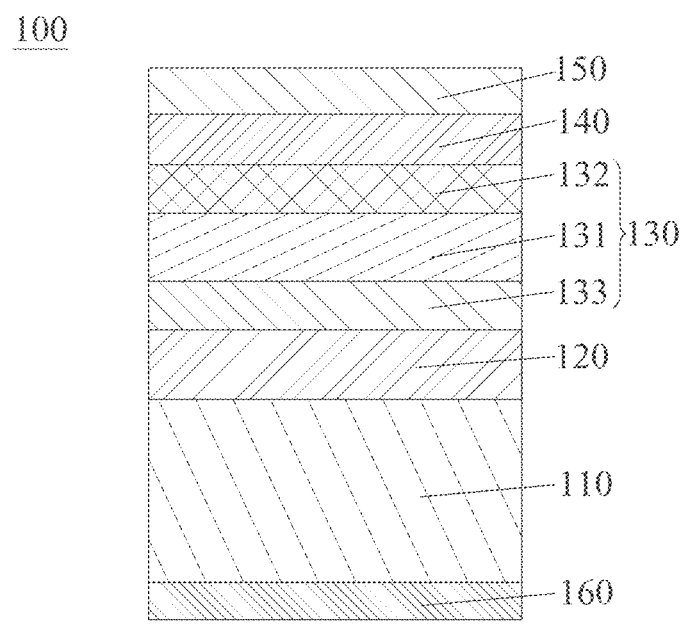
FIG. 4b is a schematic structural diagram of a thin-film white LED chip with a conventional structure according to another embodiment of the present invention.

Referring to FIGS. 4a-4b, the thin-film white LED chip 100 according to another embodiment of the present invention is a conventional structure. The difference between the conventional structure and aforementioned inverted structure is only that, the arrangement of the emissive structure 130 is different.

Specifically, the emissive structure 130 includes an electron injection layer 133, an emissive layer 131, and a hole injection layer 132 arranged in sequence. More specifically, the electron injection layer 133 is formed between the first transparent electrode 120 and the emissive layer 131, and the hole injection layer 132 is formed between the emissive layer 131 and the second transparent electrode 140, the thickness of the electron injection layer 133 is less than 1000 nm, the thickness of the hole injection layer 132 is less than 200 nm, and the total thickness of the hole injection layer 132 and the second transparent electrode 140 is less than a length of one emission wavelength of the emissive layer 131.

As in the above embodiment, the total thickness of the hole injection layer 132 and the second transparent electrode 140 may be flexibly configured according to different emissive materials of the emissive layer 131. For example, when the emissive layer 131 includes an ultraviolet emissive material with an emission wavelength between 200 nm and 430 nm, or a blue emissive material with an emission wavelength between 430 and 500 nm, the total thickness of the hole injection layer 132 and the second transparent electrode 140 is preferably less than 200 nm or less than 430 nm. In a preferred embodiment, the total thickness of the hole injection layer 132 and the second transparent electrode 140 is less than 200 nm.

In addition, just one phosphorescent/fluorescent layer 150 (the first phosphorescent/fluorescent layer 150) is configured in the thin-film white LED chip 100 with a conventional structure shown in FIG. 4a; while both a first phosphorescent/fluorescent layer 150 and a second phosphorescent/fluorescent layer 160 are configured in the thin-film white LED chip 100 with a conventional structure shown in FIG. 4b. The structure, material and molding method of other parts of the thin-film white LED chip 100 in this embodiment with the conventional structure are the same as those in aforementioned embodiment with the inverted structure, which are not repeated here therefore.

Figure 5A:
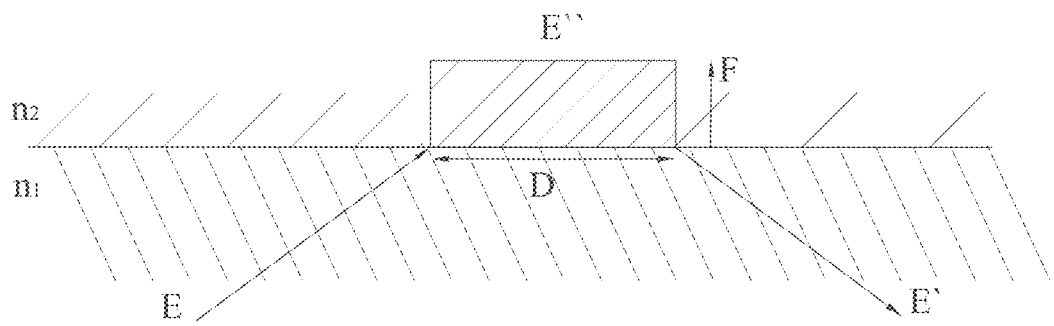
FIG. 5a is a schematic diagram of the evanescent wave penetration generated in total internal reflection when the photons propagate from a high-refractive-index material to a low-refractive-index material.

Referring to FIG. 5a, evanescent waves generated in total internal reflection when photons propagate from a high-refractive-index material to a low-refractive-index material will be described. As illustrated, the first medium layer is a high-refractive-index material with a refractive index of $n_1$, and the second medium layer is a low-refractive-index material with a refractive index of $n_2$, and $n_1 > n_2$. When the electromagnetic waves E propagate from the high-refractive-index material to the low-refractive-index material, and the incident angle is greater than the critical angle, total internal reflection will occur and generate a totally reflected electromagnetic wave E' that propagates back to the first medium layer. When the total internal reflection occurs, due to the wave property of the light, an evanescent wave E" is generated at the interface and penetrates into the second medium layer. Such an evanescent wave E" is a plane wave the direction parallel to the interface, which results in a Goos-Hanchen shift D. Meanwhile, the intensity of the evanescent wave E" decreases exponentially with depth in a direction F perpendicular to the interface, and the penetration depth of the evanescent wave E" is about the order of one wavelength of the incident light. However, since the average Poynting vector of the evanescent waves in the vertical direction F is zero, there is no actual photon that can propagate to the far field in this direction, and all photons are totally reflected into the first medium layer.

Figure 5B:
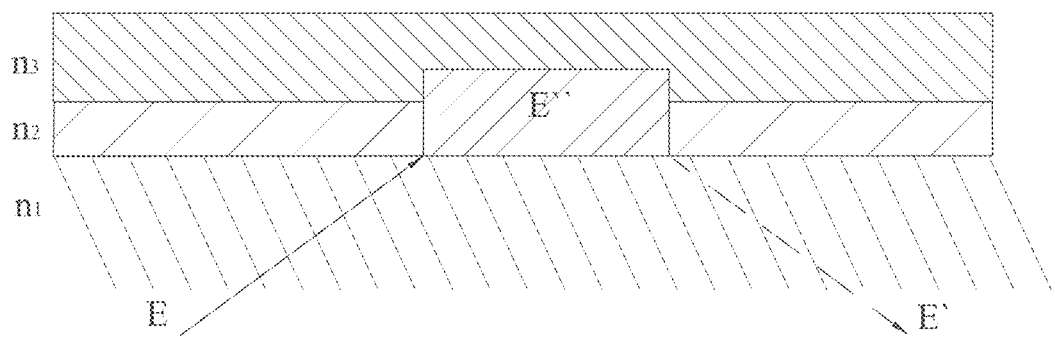
FIG. 5b is a schematic diagram of the evanescent wave penetration generated in total internal reflection when the photons propagate from a high-refractive-index material to a low-refractive-index material with small thickness (within a length of one wavelength of the incident light), in the presence of a third medium layer that can absorb incident light.

As shown in FIG. 5b, if a third medium layer (with refractive index of $n_3$) that can absorb incident photons is introduced within the penetration depth of evanescent wave, a part of energy of the evanescent wave will be absorbed, which reduces the photons reflected to the first medium layer, and therefore suppresses the total internal reflection. Furthermore, if the energy of the evanescent wave is absorbed by the third medium layer and then excite phosphorescence/fluorescence in the third medium layer, then the photons beyond the critical angle in the first medium layer can be utilized. In this case, the efficiency of the whole process depends on the photoluminescence quantum efficiency of the third medium layer and the thickness of the second medium layer. Therefore, by utilizing such near-field coupling with the evanescent waves as the bridge, the photons originally confined inside the device by the total internal reflection can be gradually absorbed by the third medium layer, and then converted into actual photons which can escape to the far-field, which significantly increases the external quantum efficiency of the LED chip.

As shown in FIGS. 3a-4b and 5b, in most cases, the refractive index of the emissive layer 131 in the LED chip 100 is greater than that of the electron injection layer 133 or the hole injection layer 132. According to the mechanism shown in FIG. 5b, when the emissive layer 131 is served as the first medium layer, the multi-layer of the electron injection layer 133 and the second transparent electrode 140 are served as the second medium layer (see the inverted structure in FIGS. 3a-3b), or the multi-layer of the hole injection layer 132 and the second transparent electrode 140 are served as the second medium layer (see the conventional structure in FIGS. 4a-4b), and the first phosphorescent/fluorescent layer 150 is served as the third medium layer, the overall external quantum efficiency of the LED chip can be improved, meanwhile white light emission can be realized by combination of the emission of the emissive layer 131 and the first phosphorescent/fluorescent layer 150, thereby solving the issue that the white LED can only excite the far-field phosphorescent/fluorescent materials through a blue (or ultraviolet) LED chip in the prior art which generally leads to an inferior device efficiency.

Now referring to FIG. 3a again, taking a quantum dot bicolor white LED chip with inverted structure as an example, a specific implementation of the thin-film white LED chip 100 of the present invention will be described.

Specifically, the structure of the quantum dot bicolor white LED chip 100 is shown in FIG. 3a, wherein the transparent substrate 110 is glass, the first transparent electrode 120 is an indium tin oxide (ITO) transparent electrode, the hole injection layer 132 is poly(3,4-ethylenedioxythiophene)-polystyrene sulfonic acid (PEDOT:PSS), the emissive layer 131 is cadmium selenide (CdSe) quantum dots, the electron injection layer 133 is 1,3,5-tri(1-phenyl-1H-benzimidazol-2-yl)benzene (TPBi), and the second transparent electrode 140 is lithium fluoride/aluminum/silver (LiF/Al/Ag). In addition, a first phosphorescent/fluorescent layer 150 which is red quantum dot CdTe is deposited on the second transparent electrode 140. It should be noted that, if the first phosphorescent/fluorescent layer 150 is not deposited, a quantum dot blue LED chip with inverted structure is formed.

Referring to FIG. 3a again, the preparation steps of the quantum dot bicolor white LED chip 100 of this specific embodiment follow: before starting the preparation, firstly conducting ultrasonic cleaning to the ITO conductive glass by using isopropanol, deionized water, detergent, deionized water, and isopropanol in sequence; and then placing the ITO conductive glass in an oven to dry; and additionally cleaning the ITO conductive glass in a plasma cleaner for 4 minutes, before use.

At the beginning of preparation, firstly, PEDOT:PSS (CLEVIOS P VP CH 8000) is spin-coated on the ITO conductive glass at a high spin speed using a spin coater (KW-4A), with a thickness of about 30 nm, and then is annealed at 120° C. for 20 min to obtain a hole injection layer 132; then, CdSe is spin-coated on the hole injection layer 132 to obtain a emissive layer 131 with a thickness of about 20 nm; then an electron injection layer 133 and a second transparent electrode 140 are formed. Specifically, a TPBi electron injection layer, an electron injection interfacial material LiF, and an ultra-thin Al/Ag electrode are sequentially deposited on the CdSe emissive layer 131 by evaporation, with their thicknesses of 35 nm, 1 nm and 10 nm respectively. Finally, a first phosphorescent/fluorescent layer 150 (CdTe) is deposited on the ultra-thin Al/Ag electrode by spin coating, with a thickness of about 100 nm. The above steps are completed to obtain a quantum dot bicolor white LED chip 100. If the first phosphorescent/fluorescent layer 150 is not deposited, a quantum dot blue LED chip with inverted structure is obtained.

Figure 6A:
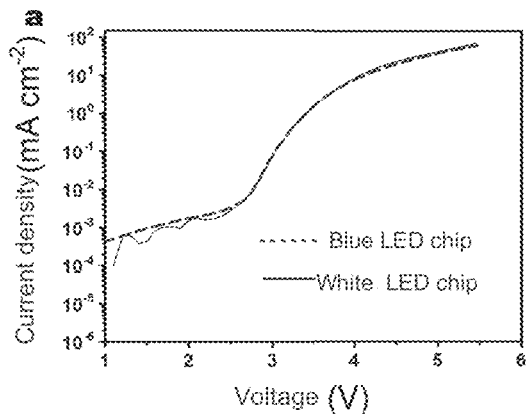
FIG. 6a shows voltage—current density curves of a quantum dot blue LED chip and a quantum dot bicolor white LED chip.
Figure 6B:
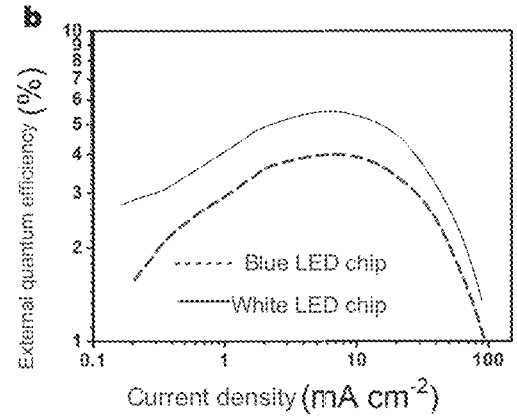
FIG. 6b shows current density—external quantum efficiency curves of a quantum dot blue LED chip and a quantum dot bicolor white LED chip.

As shown in FIGS, 3a and 6a-6b, electrical characteristics and external quantum efficiency between a quantum dot blue LED chip with inverted structure and a quantum dot bicolor white LED chip 100 of the present invention are compared. FIG. 6a shows the voltage—current density curves of the quantum dot blue LED chip and the quantum dot bicolor white LED chip, which illustrate that the presence of the first phosphorescent/fluorescent layer 150 has no impact on the electrical properties of the device. In addition, FIG. 6b shows the current density—external quantum efficiency curves of the quantum dot blue LED chip and the quantum dot bicolor white LED chip. Because the refractive index (about 2.3) of the quantum dot emissive layer 131 is much larger than the refractive index (about 1.7) of the TPBi electron injection layer 133, the extraction of photons will be greatly limited due to the total internal reflection, which results in a low external quantum efficiency (about 4%) of the quantum dot blue LED chip. However, after the first phosphorescent/fluorescent layer 150 is introduced, because the evanescent wave generated during the total internal reflection is utilized (i.e. the evanescent wave is absorbed by the first phosphorescent/fluorescent layer 150 and then the phosphorescence/fluorescence is emitted), therefore the actual utilization of photons inside the chip is improved, and the external quantum efficiency of the chip is increased to 5.7%, with an increase of about 43%.

Figure 7A:
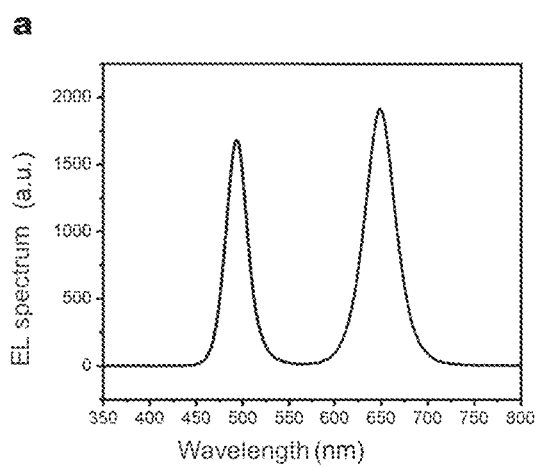
FIG. 7a is an electroluminescence spectrum of a quantum dot bicolor white LED chip.
Figure 7B:
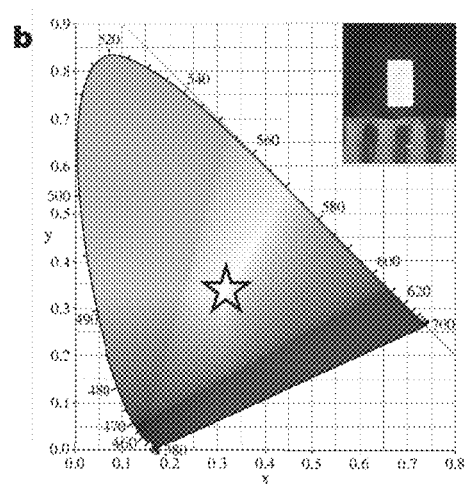
FIG. 7b is a chromaticity coordinate diagram of a quantum dot bicolor white LED chip.

As shown in FIGS. 3a and 7a-7b, since the light emission of the quantum dot bicolor white LED chip 100 in this specific embodiment is composed of sky blue light (emitted by the chip) and red light (emitted by the phosphorescent/fluorescent layer), therefore, as the spectrum shown in FIG. 7a, bicolor white light is formed based on the complementary-color principle; as shown in the chromaticity coordinates of FIG. 7b, the chromaticity coordinate of the quantum dot bicolor white LED chip 100 is (0.33, 0.33), indicating the generation of pure white light.

Referring to FIG. 3b again, taking an organic-inorganic hybrid perovskite tricolor white LED chip 100 with inverted structure as an example, the thin-film white LED chip 100 according to another specific implementation of the present invention is described.

Specifically, the structure of the perovskite tricolor white LED chip 100 is shown in FIG. 3b, wherein the transparent substrate 110 is glass, the first transparent electrode 120 is a ITO transparent electrode, the hole injection layer 132 is PEDOT:PSS, the emissive layer 131 is an organic-inorganic hybrid perovskite $PEA_2Cs_{n-1}Pb_n(Cl_xBR_{1-x})_{3n+1}$, the electron injection layer 133 is TPBi, and the second transparent electrode 140 is LiF/Al/Ag. In addition, a first phosphorescent/fluorescent layer 150 which is red perovskite $CsPbBr_{0.5}I_{2.5}$ is deposited on the second transparent electrode 140; and a second phosphorescent/fluorescent layer 160 which is green perovskite $CsPbBr_{2.5}I_{0.5}$ is deposited on the bottom side of the transparent substrate 110.

It should be noted that, if the first phosphorescent/fluorescent layer 150 and the second phosphorescent/fluorescent layer 160 are not deposited, a perovskite blue LED chip with inverted structure is formed.

Referring to FIG. 3b again, the preparation steps of the organic-inorganic hybrid perovskite tricolor white LED chip 100 of this specific embodiment follow: before use, firstly conducting ultrasonic cleaning to the ITO conductive glass by using isopropanol, deionized water, detergent, deionized water, and isopropanol in sequence; and then placing the ITO conductive glass in an oven to dry; and additionally cleaning the ITO conductive glass in a plasma cleaner for 4 minutes, before manufacturing.

At the beginning of preparation, firstly, PEDOT:PSS (CLEVIOS P VP CH 8000) is spin-coated on the ITO conductive glass at a high spin speed using a spin coater (KW-4A), with a thickness of about 30 nm, and then is annealed at 120° C. for 20 minutes to obtain a hole injection layer 132; then, $PEA_2Cs_{n-1}Pb_n(Cl_xBr_{1-x})_{3n+1}$ is spin-coated on the hole injection layer 132 to obtain an emissive layer 131 with a thickness of about 50 nm, and then is annealed at 70° C. for 5 minutes to obtain a emissive layer 131; then, an electron injection layer 133 and a second transparent electrode 140 are formed. Specifically, an electron injection layer TPBi, an electron injection interfacial material LiF, and an ultra-thin Al/Ag electrode are sequentially deposited on the emissive layer 131 by evaporation, with their thickness of 35 nm, 1 nm and 10 nm respectively. Finally, a first phosphorescent/fluorescent layer 150 ($CsPbBr_{0.5}I_{2.5}$) is deposited on the ultra-thin Al/Ag electrode by spin coating, with a thickness of about 100 nm, and a second phosphorescent/fluorescent layer 160 ($CsPbBr_{2.5}I_{0.5}$) is spin-coated on the glass substrate, with a thickness of about 50 nm. So far, the preparation steps are completed. If the first phosphorescent/fluorescent layer 150 and the second phosphorescent/fluorescent layer 160 are not deposited, a perovskite blue LED chip with inverted structure is obtained.

As shown in FIGS. 3b and 8a-6b, electrical characteristics and external quantum efficiency between a perovskite blue LED chip with inverted structure and a perovskite tricolor white LED chip 100 of the present invention are compared. FIG. 8a shows voltage—current density curves of a perovskite blue LED chip and a perovskite tricolor white LED chip, which illustrates that the presences of the first phosphorescent/fluorescent layer 150 and the second phosphorescent/fluorescent layer 160 have no impact on the electrical properties on the device.

In addition, FIG. 8b shows current density—external quantum efficiency curves of the perovskite blue LED chip and the perovskite tricolor white LED chip. Because the refractive index (about 2.5) of the perovskite emissive layer 131 is much larger than the refractive index (about 1.7) of the TPBi electron injection layer 133, and similarly the extraction of photons is greatly limited due to the total internal reflection, which results in a low external quantum efficiency (about 3.5%) of the perovskite blue LED chip. However, after the first phosphorescent/fluorescent layer 150 is introduced, because the evanescent wave generated during the total internal reflection are utilized (i.e. the evanescent wave is absorbed by the first phosphorescent/fluorescent layer 150 and then the phosphorescence/fluorescence is emitted, therefore the actual utilization of photons inside the chip is improved, and the external quantum efficiency of the chip is increased to 4.8%, with an increase of about 37%.

It should be noted that the increase of the external quantum efficiency is not as good as that in the aforementioned quantum dot bicolor white LED chip 100, that's because the introduction of the second phosphorescent/fluorescent layer 160 in the far field makes no positive contribution to the external quantum efficiency of the device, but makes a negative contribution due to the photoluminescence quantum efficiency less than 100%, However, the external quantum efficiency of the perovskite tricolor white LED chip of this specific embodiment is still much higher than that of the perovskite white LED chip in the prior art.

As shown in FIGS. 3b and 9a-9b, the perovskite tricolor white LED chip in this specific embodiment is composed of blue light (emitted by the chip), red light (emitted by the first phosphorescent/fluorescent layer 150), and green light (emitted by the second phosphorescent/fluorescent layer 160), as shown in FIG. 9a. In this case a tricolor white light is formed based on trichromatic principle. As shown in the chromaticity coordinates of FIG. 9b, the chromaticity coordinate of the perovskite bicolor white LED chip 100 is (0.29, 0.37), indicating the generation of white light.

In summary, the thin-film white LED chip 100 of the present invention includes a transparent substrate 110, a first transparent electrode 120, an emissive structure 130, a second transparent electrode 140, and a first phosphorescent/fluorescent layer 150 respectively arranged in sequence. Specifically, the emissive structure 130 includes a emissive layer 131, an electron injection layer 133 and a hole injection layer 132 respectively formed at both sides of the emissive layer 131, and a total thickness of the electron injection layer 133 and the second transparent electrode 140 (in an inverted structure) or a total thickness of the hole injection layer 132 and the second transparent electrode 140 (in a conventional structure) is smaller than a length of one emission wavelength of the emissive layer 131. Firstly, because a reflective metal electrode in the prior art is replaced with the second transparent electrode 140, the photons emitted from the emissive layer 131 will not be totally reflected in this direction, and will have an opportunity to penetrate into the first phosphorescent/fluorescent layer 150. Secondly, the total thickness of the electron injection layer 133 and the second transparent electrode 140 (in an inverted structure) or the total thickness of the hole injection layer 132 and the second transparent electrode 140 (in a conventional structure) is less than a length of one emission wavelength of the emissive layer 131, so that the evanescent wave generated by total internal reflection can penetrate into and be absorbed by the first phosphorescent/fluorescent layer 150 so as to emit down-converted photons. By absorbing the evanescent wave and then emitting photons, the actual utilization of internal photons in the chip is improved, and hence improving the overall external quantum efficiency of the LED chip. Thereby, the lighting energy consumption is reduced, meanwhile the white light emission can be ensured, and the production cost is low.

While the invention has been described in connection with what are presently considered to be the most practical and preferred embodiments, it is to be understood that the invention is not to be limited to the disclosed embodiments, but on the contrary, is intended to cover various modifications and equivalent arrangement included within the spirit and scope of the invention.

What is claimed is:

1. A thin-film white LED chip, comprising a transparent substrate, a first transparent electrode, an emissive structure, a second transparent electrode, and a first phosphorescent/fluorescent layer respectively arranged in sequence, wherein the emissive structure comprises an emissive layer, an electron injection layer and a hole injection layer respectively formed at both sides of the emissive layer, and a total thickness of the electron injection layer and the second transparent electrode or a total thickness of the hole injection layer and the second transparent electrode is smaller than a length of one emission wavelength of the emissive layer;
wherein the first transparent electrode is directly formed on the transparent substrate, and the first phosphorescent/fluorescent layer is directly formed on the second transparent electrode; in an inverted structure, the second transparent electrode is directly formed on the electron injection layer;; in a conventional structure, the second transparent electrode is directly formed on the hole injection layer; and a spacing distance between the emissive layer and the first phosphorescent/fluorescent layer is smaller than the length of one emission wavelength of the emissive layer.

2. The thin-film white LED chip according to claim 1, wherein the emissive layer comprises an ultraviolet emissive material with an emission wavelength of 200 nm to 430 nm or a blue emissive material with an emission wavelength of 430 nm to 500 nm.

3. The thin-film white LED chip according to claim 2, wherein the emissive structure comprises the hole injection layer, the emissive layer, and the electron injection layer respectively arranged in sequence, the electron injection layer is adjacent to the second transparent electrode, and a thickness of the electron injection layer is less than 200 nm, and a thickness of the hole injection layer is less than 1000 nm.

4. The thin-film white LED chip according to claim 3, wherein materials of both the electron injection layer and the hole injection layer are at least one selected from a group consisting of organic polymer and small molecule, metal oxide, inorganic semiconductor material, and organic-inorganic composite; and a material of the emissive layer is at least one selected from a group consisting of organic material, quantum dot and nanocrystalline material, inorganic material, and organic-inorganic hybrid material.

5. The thin-film white LED chip according to claim 2, wherein the emissive structure comprises the electron injection layer, the emissive layer, and the hole injection layer respectively arranged in sequence, the hole injection layer is adjacent to the second transparent electrode, and a thickness of the hole injection layer is less than 200 nm, and a thickness of the electron injection layer is less than 1000 nm.

6. The thin-film white LED chip according to claim 5, wherein materials of both the electron injection layer and the hole injection layer are at least one selected from a group consisting of organic polymer and small molecule, metal oxide, inorganic semiconductor material, and organic-inorganic composite; and a material of the emissive layer is at least one selected from a group consisting of organic material, quantum dot and nanocrystalline material, inorganic material, and organic-inorganic hybrid material.

7. The thin-film white LED chip according to claim 2, wherein materials of both the electron injection layer and the hole injection layer are at least one selected from a group consisting of organic polymer and small molecule, metal oxide, inorganic semiconductor material, and organic-inorganic composite; and a material of the emissive layer is at least one selected from a group consisting of organic material, quantum dot and nanocrystalline material, inorganic material, and organic-inorganic hybrid material.

8. The thin-film white LED chip according to claim 1, wherein materials of both the electron injection layer and the hole injection layer are at least one selected from a group consisting of organic polymer and small molecule, metal oxide, inorganic semiconductor material, and organic-inorganic composite; and a material of the emissive layer is at least one selected from a group consisting of organic material, quantum dot and nanocrystalline material, inorganic material, and organic-inorganic hybrid material.

9. The thin-film white LED chip according to claim 1, wherein a thickness of the second transparent electrode is less than 100 nm, a thickness of the first transparent electrode is less than 1000 nm, and a material of the second transparent electrode and the first transparent electrode is at least one selected from a group consisting of ultra-thin metal film, patterned metal film, metal nanowire, metal nanorod, metal nanoparticle, organic polymer and small molecule, metal oxide, and organic-inorganic composite.

10. The thin-film white LED chip according to claim 1, further comprising a second phosphorescent/fluorescent layer formed at a side of the transparent substrate away from the first transparent electrode, and a thickness of both the first phosphorescent/fluorescent layer and the second phosphorescent/fluorescent layer is less than 1 mm.

11. The thin-film white LED chip according to claim 10, wherein both the first phosphorescent/fluorescent layer and the second phosphorescent/fluorescent layer comprise at least one selected from a group consisting of a blue emissive material with an emission wavelength of 430 nm to 500 nm, a green emissive material with an emission wavelength of 500 nm to 560 nm, a yellow emissive material with an emission wavelength of 560 nm to 600 nm, and a red emissive material with an emission wavelength of 600 nm to 780 nm.

12. The thin-film white LED chip according to claim 11, wherein the first transparent electrode, the emissive layer, the electron injection layer, the hole injection layer, the second transparent electrode, the first phosphorescent/fluorescent layer, and the second phosphorescent/fluorescent layer are formed by vapor deposition, sputtering, spin coating, blade coating, evaporation, inkjet printing, drip coating, roll-to-roll printing, slot-die coating, screen printing, spraying or mechanical printing.

13. The thin-film white LED chip according to claim 10, wherein materials of both the first phosphorescent/fluorescent layer and the second phosphorescent/fluorescent layer is at least one selected from a group consisting of organic material, quantum dot and nanocrystalline material, inorganic material, and organic-inorganic hybrid material.

14. The thin-film white LED chip according to claim 13, wherein the first transparent electrode, the emissive layer, the electron injection layer, the hole injection layer, the second transparent electrode, the first phosphorescent/fluorescent layer, and the second phosphorescent/fluorescent layer are formed by vapor deposition, sputtering, spin coating, blade coating, evaporation, inkjet printing, drip coating, roll-to-roll printing, slot-die coating, screen printing, spraying or mechanical printing.

15. The thin-film white LED chip according to claim 10, wherein the first transparent electrode, the emissive layer, the electron injection layer, the hole injection layer, the second transparent electrode, the first phosphorescent/fluorescent layer, and the second phosphorescent/fluorescent layer are formed by vapor deposition, sputtering, spin coating, blade coating, evaporation, inkjet printing, drip coating, roll-to-roll printing, slot-die coating, screen printing, spraying or mechanical printing.

* * * * *